(12) United States Patent
Ponnuvel

(10) Patent No.: US 9,293,380 B2
(45) Date of Patent: Mar. 22, 2016

(54) SYSTEM AND METHOD FOR SELECTING A DERATING FACTOR TO BALANCE USE OF COMPONENTS HAVING DISPARATE ELECTRICAL CHARACTERISTICS

(71) Applicant: Nvidia Corporation, Santa Clara, CA (US)

(72) Inventor: Gunaseelan Ponnuvel, Santa Clara, CA (US)

(73) Assignee: Nvidia Corporation, Santa Clara, CA (US)

(*) Notice: Subject to any disclaimer, the term of this patent is extended or adjusted under 35 U.S.C. 154(b) by 422 days.

(21) Appl. No.: 13/663,591

(22) Filed: Oct. 30, 2012

(65) Prior Publication Data

US 2014/0118021 A1    May 1, 2014

(51) Int. Cl.
*H01L 21/66* (2006.01)
*G01R 31/28* (2006.01)

(52) U.S. Cl.
CPC ............. *H01L 22/14* (2013.01); *H01L 22/20* (2013.01); *G01R 31/2831* (2013.01)

(58) Field of Classification Search
None
See application file for complete search history.

(56) References Cited

U.S. PATENT DOCUMENTS

| | | | |
|---|---|---|---|
| 6,574,760 B1 * | 6/2003 | Mydill | 714/724 |
| 7,417,449 B1 * | 8/2008 | Posey et al. | 324/750.3 |
| 2003/0054577 A1 * | 3/2003 | Yonezawa et al. | 438/14 |
| 2005/0055615 A1 * | 3/2005 | Agashe et al. | 714/727 |
| 2012/0102448 A1 * | 4/2012 | Haugestuen et al. | 716/134 |

* cited by examiner

*Primary Examiner* — Melissa Koval
*Assistant Examiner* — Courtney McDonnough

(57) ABSTRACT

A test system and method for selecting a derating factor to be applied to a ratio of transistors having disparate electrical characteristics in a wafer fabrication process. In one embodiment, the test system includes: (1) structural at-speed automated test equipment (ATE) operable to iterate structural at-speed tests at multiple clock frequencies over integrated circuit (IC) samples fabricated under different process conditions and (2) derating factor selection circuitry coupled to the structural at-speed ATE and configured to employ results of the structural at-speed tests to identify performance deterioration in the samples, the performance deterioration indicating the derating factor to be employed in a subsequent wafer fabrication process.

17 Claims, 2 Drawing Sheets

SYSTEM AND METHOD FOR SELECTING A DERATING FACTOR TO BALANCE USE OF COMPONENTS HAVING DISPARATE ELECTRICAL CHARACTERISTICS

TECHNICAL FIELD

This application is directed, in general, to wafer fabrication and, more specifically, to the process of choosing between transistors having disparate electrical characteristics that takes place during silicon compiling.

BACKGROUND

Wafer fabrication is the process by which integrated circuits (ICs) are manufactured. It is basically a process by which a silicon wafer substrate is repeatedly coated, etched and rinsed to form ICs. The wafer is then cut to separate the ICs, which may then be molded into packages for mounting on circuit boards or the like.

Wafer fabrication is an imperfect process subject to manufacturing variations and defects, however slight they may be. A highly competitive wafer fabrication industry pays a great deal of attention to the occurrence and impact of these variations and defects, some of which can lead to quantities of wafers being deemed unusable. The percentage of wafers in a particular batch that are useable is referred to as yield. Yield is particularly likely to decline when fabrication is carried out under extreme conditions or with extreme fabrication parameters, otherwise known as process corners.

The IC industry is largely demand driven, and consequently, wafer fabrication tends to be carried out with specific end products and production yield in mind. Accordingly, the industry has developed a multitude of tests that narrowly identify sub-optimal wafer fabrication, allowing IC manufacturers to more precisely direct their wafer manufacturing and inventory. Manufacturing defects bringing a wafer below the threshold of usability is known as yield impact. Yield is ideally 100%, but can practically be much lower with respect to certain wafer products.

Many IC manufacturers conservatively manage yield by applying more strict fabrication targets with an expectation of some natural variance, and sometimes a violation, of those targets. A "derating factor" performs this function. The derating factor is a buffer against inherent variation in the wafer fabrication process. The conservative approach is common practice in IC design and wafer fabrication and has proven effective preventing yield loss.

SUMMARY

One aspect provides a test system for selecting a derating factor to be applied to a ratio of transistors having disparate electrical characteristics in a wafer fabrication process, including: (1) structural at-speed automated test equipment (ATE) operable to iterate structural at-speed tests at multiple clock frequencies over IC samples fabricated under different process conditions and (2) derating factor selection circuitry coupled to the structural at-speed ATE and configured to employ results of the structural at-speed tests to identify performance deterioration in the samples, the performance deterioration indicating the derating factor to be employed in a subsequent wafer fabrication process.

Another aspect provides a method of selecting a derating factor to be applied to a ratio of transistors having disparate electrical characteristics in a wafer fabrication process, including: (1) carrying out structural at-speed tests at multiple clock frequencies on IC samples fabricated under different process conditions and (2) employing results of the structural at-speed tests to identify performance deterioration in the samples, the performance deterioration indicating the derating factor to be employed in a subsequent wafer fabrication process.

Yet another aspect provides a method of selecting a derating factor to be applied to a ratio of transistors having disparate electrical characteristics in a wafer fabrication process, including: (1) carrying out structural at-speed tests at multiple clock frequencies on IC sample wafers fabricated under conditions at least proximate fabrication process extremes of the wafer fabrication process and (2) employing results of the structural at-speed tests to identify performance deterioration in the sample wafers, the performance deterioration indicating the derating factor to be employed in a subsequent wafer fabrication process.

BRIEF DESCRIPTION

Reference is now made to the following descriptions taken in conjunction with the accompanying drawings, in which.

DETAILED DESCRIPTION

Figure 1:
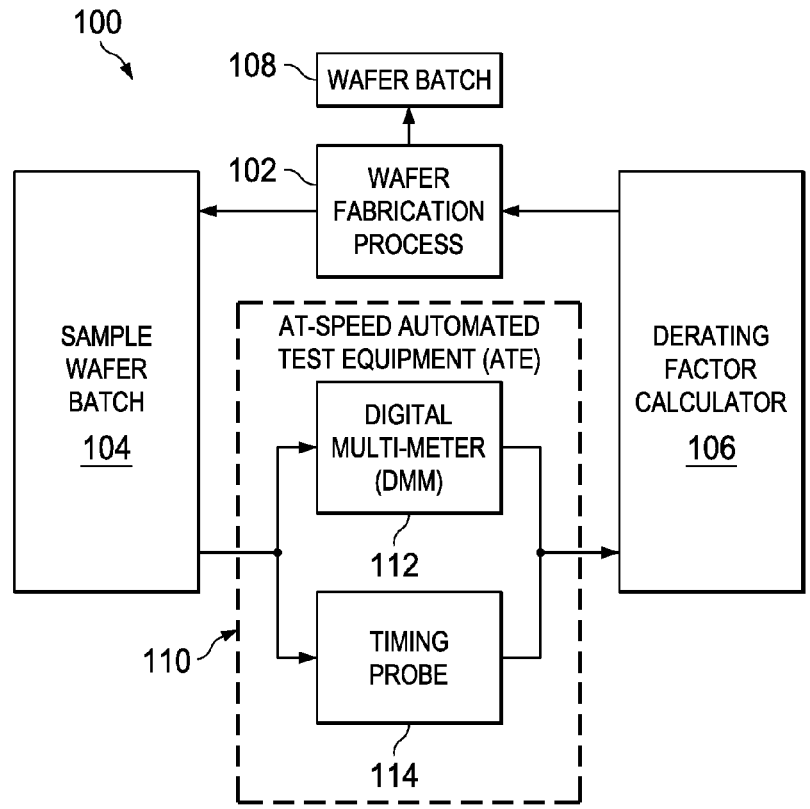
FIG. 1 is a block diagram of one embodiment of a test system for selecting a derating factor to be applied in a wafer fabrication process.

Before describing various embodiments of the test system or method introduced herein, wafer fabrication and derating will be generally described.

Wafer fabrication is carried out in a tightly controlled environment that lends itself to maximizing fabrication yield for a given wafer batch. The slightest change in temperature, pressure, humidity or many other environmental conditions creates variances in the characteristics of the ICs produced. Variances also arise from the imperfect formation of ICs with respect to specifically called out components such as n-type and p-type metal-oxide-semiconductor field effect transistors, also known as MOSFETs, or simply FETs. A FET has an inherent threshold voltage, $V_{th}$, that serves to classify the transistor as a high-voltage threshold (HVT), standard-voltage threshold (SVT) or low-voltage threshold (LVT) transistor. A corollary to this classification is speed performance versus power performance, or, more specifically, leakage current. HVT transistors are more resistant to leakage current but are slower performing transistors. Conversely, SVT transistors are faster, but are more susceptible to leakage current. LVT transistors are faster still, but are most susceptible to leakage current. The threshold voltage of a transistor ultimately depends on fabrication targets and variances. Consequently, the speed and power performance of a wafer are highly dependent on where in the fabrication process the wafer originated with respect to IC design margins. That is to say, yield depends on the environmental conditions and wafer design parameters under which the wafers are fabricated.

Electronics designers often rely on design software, rather than manual effort, to place individual HVT, SVT and LVT transistors in an IC design. Designers control the automated placement by simple ratios of SVT to HVT or SVT to LVT transistors. These ratios ultimately have a significant impact on the overall performance of an IC, particularly when the ratios are selected too aggressively. Over-use of HVT transistors may lead to chokepoints on critical paths within the IC, bringing down the speed qualifications of the wafer. Likewise, an overly conservative design may lead to waste. Derating with respect to speed performance and power performance of an IC is achieved via the derating factor on saturation currents of HVT devices. A derating factor applied to transistor threshold voltages holds the speed of the devices artificially low, reducing the likelihood of a high-voltage threshold (i.e., slower) device appearing on a critical path. A high voltage threshold derating factor yields fewer high-voltage threshold transistors and increased leakage current; and a low voltage threshold derating factor yields more high-voltage threshold transistors and decreased leakage current. Conservative IC designers borrow the concept of derating to build in margin.

It is fundamentally realized herein that IC designers are often too conservative in IC design. The overly-conservative approach leads to wasteful designs, but high yields. It is realized herein IC design may be done more aggressively without sacrificing yield. It is realized herein that IC designs often use overly conservative derating factors to direct wafer fabrication. It is further realized herein the derating factors lead to ICs fabricated with too much speed margin and inefficient power utilization. Similarly, overly conservative derating factors lead to slow ICs with too much power margin.

It is fundamentally realized herein that yield loss in aggressive IC design is often concentrated in the wafer fabrication process corners. It is further realized herein a performance analysis of wafers produced in the fabrication process corners over a range of operating frequencies reveals more precise wafer fabrication process boundaries. It is also realized herein that wafer fabrication within those boundaries produces high-yield wafer batches.

It is realized herein that at-speed testing of wafers produced in the fabrication process corners over the range of operating frequencies is useful in identifying the precise process boundaries. It is further realized herein measurements of minimum operating voltage with respect to speed across the range of operating frequencies effectively illustrate ever-so subtle performance degradations at these precise fabrication boundaries. These precise fabrication boundaries translate into more aggressive derating factors that maintain high-yield wafer fabrication.

Having generally described wafer fabrication, derating and certain relevant realizations, various embodiments of the test system and method introduced herein will be described.

FIG. 1 is a block diagram of one embodiment of a test system 100 for selecting a derating factor to be applied to a voltage threshold ratio in a wafer fabrication process 102. Alternate embodiments may apply a derating factor to saturation current ratios or some other disparate electrical characteristic of the transistor devices. The test system 100 includes the wafer fabrication process 102, a sample wafer batch 104, a derating factor calculator 106 and at-speed ATE 110. The at-speed ATE includes a digital multi-meter (DMM) 112 and a timing probe 114. In alternate embodiments at-speed ATE may include voltage sources, current measurement transistors, spectrum analyzers, oscilloscopes, logic analyzers, and many other devices.

In the test system 100 of FIG. 1, the wafer fabrication process 102 is used to produce the sample wafer batch 104. The sample wafer batch 104 includes wafers produced under a variety of process conditions, and in certain embodiments, wafers produced in the fabrication process corners. The process corners are the outer boundaries of fabrication process conditions or IC design parameters. In certain embodiments the process corners are with respect to temperatures under which the sample wafer batch 104 is fabricated. In other embodiments, the process corners are with respect to saturation current ratios or voltage threshold ratios.

The test system 100 of FIG. 1 carries out a series of structural at-speed tests using the at-speed ATE 110. In certain embodiments the at-speed tests measure minimum operating voltage and signal propagation time. The structural at-speed tests are carried out using multiple clock frequencies to allow analysis to comprehend a full range of operating frequencies and to monitor performance as a function of minimum operating voltage with respect to clock frequency. The derating factor calculator 106 employs results of the structural at-speed tests to identify performance deteriorations as a function of minimum operating voltage with respect to clock frequency. When a deterioration is recognized, it points to a wafer fabrication parameter boundary and the derating factor is determined.

The derating factor produced by the derating factor calculator 106 is fed back and employed by the wafer fabrication process 102. The wafer fabrication process ultimately produces a wafer batch 108 according to the derating factor.

Figure 2:
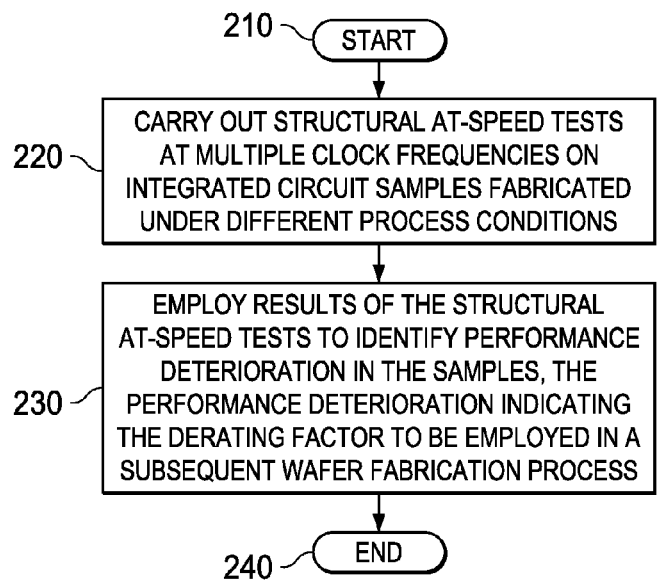
FIG. 2 is flow diagram of one embodiment of a method of selecting a derating factor to be applied in a wafer fabrication process.

FIG. 2 is a flow diagram of one embodiment of a method of selecting a derating factor to be applied to a SVT to HVT ratio in a wafer fabrication process. The method begins at a start step 210. At a step 220 structural at-speed tests are carried out on IC samples fabricated under different process conditions. In alternate embodiments the process conditions may include extreme ambient temperatures during fabrication. In other embodiments the process conditions are with respect to IC design parameters such as LVT to SVT, SVT to HVT ratios, n-type to p-type FET ratios, or slow-fast-typical.

Continuing the method of FIG. 2, the structural at-speed tests are carried out at multiple clock frequencies to produce data capturing the IC performance over those operating frequencies. In alternate embodiments the structural at-speed tests measure structural minimum voltage to use as an indicator of expected leakage current through NFET and PFET transistors. In other embodiments speed is measured over critical paths of the IC.

Continuing again the method of FIG. 2, the results of the structural at-speed tests are employed at step 230 where deteriorations in performance are recognized and then used to derive a derating factor. Deteriorations of concern are essentially situations where performance curves diverge as a function of clock frequency. When these divergences occur, they indicate a more precise outer bound on the fabrication process, within which yield is not impacted. The derived derating factor is then applied to subsequent wafer fabrication processes and the method ends at an end step 240.

Figure 3:
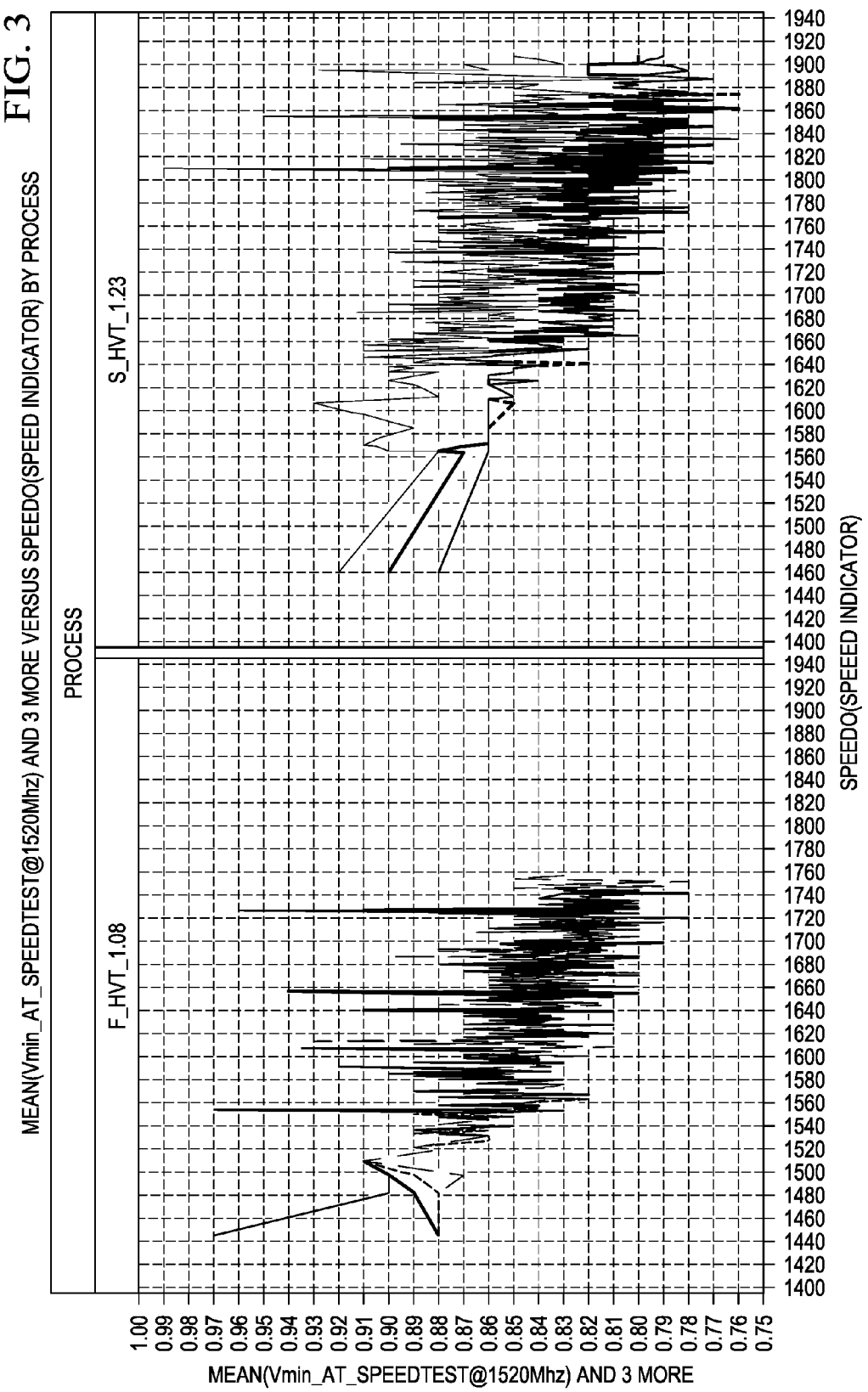
FIG. 3 is an illustration of at-speed test results.

FIG. 3 is a graph of minimum operating voltage distributions with respect to IC speed and clock frequency. The various distributions are plotted across slow-typical-fast process corners. The X-axis represents IC speed while the Y-axis represents minimum operating voltage. The various colored trend lines represent a variety of clock frequencies. The slow-typical-fast process corner is with respect to SVT transistors. For instance, the plots labeled "F_HVT_1.08" indicate HVT devices are performing faster with respect to HVT targets, while SVT devices are on target. As such, the derating factor has room to increase to bring performance down to target. Likewise, the plots labeled "S_HVT_1.23" indicate HVT devices are performing slower with respect to HVT targets, while SVT devices are on target. As such, the derating factor has room to decrease to bring performance up to target.

Those skilled in the art to which this application relates will appreciate that other and further additions, deletions, substitutions and modifications may be made to the described embodiments.

What is claimed is:

1. A test system for selecting a derating factor to be applied to a ratio of transistors having disparate electrical characteristics in a wafer fabrication process, comprising:
   structural at-speed automated test equipment (ATE) operable to iterate structural at-speed tests at multiple clock frequencies over integrated circuit (IC) samples fabricated under different process conditions; and
   derating factor selection circuitry coupled to said structural at-speed ATE and configured to employ results of said structural at-speed tests to identify performance deterioration in said samples, said performance deterioration indicating said derating factor to be employed in a subsequent wafer fabrication process, wherein said derating factor is applied to a ratio of high-voltage threshold (HVT) transistors to standard-voltage threshold (SVT) transistors.

2. The test system recited in claim 1 wherein said structural at-speed ATE is configured to measure a minimum operating voltage as an indicator of leakage current.

3. The test system recited in claim 1 wherein said structural at-speed ATE is configured to measure critical paths in said samples.

4. The test system recited in claim 1 wherein said batch of wafers comprises wafers fabricated under conditions at least proximate fabrication process extremes of said wafer fabrication process.

5. The test system recited in claim 4 wherein said fabrication process extremes are with respect to ambient temperature during fabrication.

6. The test system recited in claim 4 wherein said fabrication process extremes are with respect to target SVT to HVT ratios.

7. A method of selecting a derating factor to be applied to a ratio of transistors having disparate electrical characteristics in a wafer fabrication process, comprising:
   carrying out structural at-speed tests at multiple clock frequencies on integrated circuit (IC) samples fabricated under different process conditions; and
   employing results of said structural at-speed tests to identify performance deterioration in said samples, said performance deterioration indicating said derating factor to be employed in a subsequent wafer fabrication process, wherein said derating factor is applied to a ratio of high-voltage threshold (HVT) transistors to standard-voltage threshold (SVT) transistors.

8. The method recited in claim 7 wherein said ratio of transistors is a ratio of transistor saturation currents.

9. The method recited in claim 7 wherein said carrying out at-speed tests includes measuring minimum operating voltages as an indicator of leakage current through field effect transistors in said samples.

10. The method recited in claim 7 wherein said carrying out includes measuring speeds of critical paths in said samples.

11. The method recited in claim 7 wherein said IC samples are fabricated under conditions at least proximate fabrication process extremes of said wafer fabrication process.

12. The method recited in claim 11 wherein said fabrication process extremes are with respect to ambient temperature during fabrication.

13. A method of selecting a derating factor to be applied to a ratio of transistors having disparate electrical characteristics in a wafer fabrication process, comprising:
   carrying out structural at-speed tests at multiple clock frequencies on integrated circuit (IC) sample wafers fabricated under conditions at least proximate fabrication process extremes of said wafer fabrication process; and
   employing results of said structural at-speed tests to identify performance deterioration in said sample wafers, said performance deterioration indicating said derating factor to be employed in a subsequent wafer fabrication process, wherein said derating factor is applied to a ratio of high-voltage threshold (HVT) transistors to standard-voltage threshold (SVT) transistors.

14. The method recited in claim 13 wherein said carrying out at-speed tests includes measuring minimum operating voltages as an indicator of leakage current through field effect transistors in said sample wafers.

15. The method recited in claim 13 wherein said carrying out includes measuring speeds of critical paths in said sample wafers.

16. The method recited in claim 13 wherein said IC sample wafers are fabricated under conditions at least proximate fabrication process extremes of said wafer fabrication process.

17. The method recited in claim 16 wherein said fabrication process extremes are with respect to ambient temperature during fabrication.

\* \* \* \* \*